(12) United States Patent
Shirai et al.

(10) Patent No.: US 10,594,062 B2
(45) Date of Patent: Mar. 17, 2020

(54) PRESS-FIT TERMINAL CONNECTION STRUCTURE HAVING TYPES OF ALLOY LAYER

(71) Applicants: AUTONETWORKS TECHNOLOGIES, LTD., Yokkaichi-shi, Mie (JP); SUMITOMO WIRING SYSTEMS, LTD., Yokkaichi-shi, Mie (JP); SUMITOMO ELECTRIC INDUSTRIES, LTD., Osaka-shi, Osaka (JP)

(72) Inventors: Yoshimasa Shirai, Yokkaichi (JP); Yasushi Saitoh, Yokkaichi (JP); Kingo Furukawa, Yokkaichi (JP); Tetsuhiko Kawasaki, Yokkaichi (JP); Masayuki Ookubo, Yokkaichi (JP); Hajime Watanabe, Yokkaichi (JP); Yoshiyasu Tsuchiya, Yokkaichi (JP); Akihiro Kato, Yokkaichi (JP)

(73) Assignees: AUTONETWORKS TECHNOLOGIES, LTD., Mie (JP); SUMITOMO WIRING SYSTEMS, LTD., Yokkaichi-shi (JP); SUMITOMO ELECTRIC INDUSTRIES, LTD., Osaka-shi (JP)

( * ) Notice: Subject to any disclaimer, the term of this patent is extended or adjusted under 35 U.S.C. 154(b) by 0 days.

(21) Appl. No.: 16/300,340

(22) PCT Filed: May 11, 2017

(86) PCT No.: PCT/JP2017/017864
§ 371 (c)(1),
(2) Date: Nov. 9, 2018

(87) PCT Pub. No.: WO2017/199846
PCT Pub. Date: Nov. 23, 2017

(65) Prior Publication Data
US 2019/0140376 A1 May 9, 2019

(30) Foreign Application Priority Data

May 19, 2016 (JP) .................................. 2016-100071
Mar. 28, 2017 (JP) .................................. 2017-062642

(51) Int. Cl.
*H01R 12/00* (2006.01)
*H05K 1/00* (2006.01)
(Continued)

(52) U.S. Cl.
CPC ............. *H01R 12/585* (2013.01); *C25D 5/12* (2013.01); *C25D 7/00* (2013.01); *H01R 13/035* (2013.01); *H05K 2201/1059* (2013.01)

(58) Field of Classification Search
CPC .... H01R 12/585; H01R 13/03; H01R 13/035; C25D 5/12
(Continued)

(56) References Cited

U.S. PATENT DOCUMENTS 5,916,695 A * 6/1999 Fister ..................... B32B 15/01
428/646
8,016,624 B2 * 9/2011 Oda ......................... C25D 5/12
428/646
(Continued)

FOREIGN PATENT DOCUMENTS

JP    2010-262863 A    11/2010
JP    2012-248423 A    12/2012
(Continued)

OTHER PUBLICATIONS

Aug. 1, 2017 Search Report issued in International Patent Application No. PCT/JP2017/017864.

*Primary Examiner* — Hae Moon Hyeon
(74) *Attorney, Agent, or Firm* — Oliff PLC

(57) ABSTRACT

It is aimed to provide a press-fit terminal connection structure in which a board connecting portion of a press-fit
(Continued)

terminal is press-fit into a through hole provided in a printed circuit board and which can combine the suppression of scraping of a surface layer and a reduction of a necessary load when the press-fit terminal is inserted into and withdrawn from the through hole and an improvement of a holding force for keeping the press-fit terminal inserted in the through hole. In the press-fit terminal connection structure, the press-fit terminal includes, at least on a surface of the contact point portion, an alloy containing layer mainly containing tin and palladium, and the through hole includes a tin layer on an outermost surface of an inner peripheral surface including at least the contact point portion.

15 Claims, 9 Drawing Sheets

(51) Int. Cl.
*H01R 12/58* (2011.01)
*H01R 13/03* (2006.01)
*C25D 7/00* (2006.01)
*C25D 5/12* (2006.01)

(58) Field of Classification Search
USPC .......................................... 439/82, 751, 886
See application file for complete search history.

(56) References Cited

U.S. PATENT DOCUMENTS

| | | | | |
|---|---|---|---|---|
| 9,728,878 | B2* | 8/2017 | Shibuya | C25D 5/12 |
| 2004/0038072 | A1* | 2/2004 | Miura | H01L 23/49582 |
| | | | | 428/668 |
| 2005/0176267 | A1* | 8/2005 | Saitoh | H01R 12/585 |
| | | | | 439/49 |
| 2006/0264076 | A1* | 11/2006 | Chen | H01R 12/585 |
| | | | | 439/82 |
| 2007/0093143 | A1* | 4/2007 | Nomura | H01R 12/585 |
| | | | | 439/751 |
| 2008/0188100 | A1* | 8/2008 | Saitoh | H01R 12/585 |
| | | | | 439/82 |
| 2010/0311288 | A1* | 12/2010 | Horn | C23C 28/023 |
| | | | | 439/886 |
| 2012/0009496 | A1* | 1/2012 | Shibuya | B32B 15/018 |
| | | | | 429/455 |
| 2014/0213080 | A1* | 7/2014 | Miyake | H01R 12/585 |
| | | | | 439/82 |
| 2014/0329107 | A1* | 11/2014 | Shibuya | B32B 15/01 |
| | | | | 428/642 |
| 2015/0011132 | A1* | 1/2015 | Shibuya | C25D 5/12 |
| | | | | 439/887 |
| 2015/0133005 | A1* | 5/2015 | Saka | H01R 13/03 |
| | | | | 439/887 |
| 2015/0147924 | A1* | 5/2015 | Shibuya | C25D 5/10 |
| | | | | 439/887 |
| 2015/0171537 | A1* | 6/2015 | Shibuya | C25D 5/10 |
| | | | | 361/773 |
| 2015/0194746 | A1* | 7/2015 | Shibuya | C25D 5/12 |
| | | | | 439/887 |
| 2015/0295333 | A1* | 10/2015 | Shibuya | C25D 5/10 |
| | | | | 439/887 |
| 2016/0240950 | A1* | 8/2016 | Watanabe | H01R 13/03 |
| 2016/0254608 | A1* | 9/2016 | Takahashi | C25D 3/12 |
| | | | | 439/886 |
| 2017/0302016 | A1* | 10/2017 | Watanabe | C25D 5/505 |

FOREIGN PATENT DOCUMENTS

| | | |
|---|---|---|
| JP | 2016-018726 A | 2/2016 |
| WO | 2008/038331 A1 | 4/2008 |
| WO | 2011/125747 A1 | 10/2011 |

\* cited by examiner (a)

(b)

(a)

(b)

(a)

(b)

(c)

(a)

(b)

PRESS-FIT TERMINAL CONNECTION STRUCTURE HAVING TYPES OF ALLOY LAYER

TECHNICAL FIELD

The present disclosure relates to a press-fit terminal connection structure, more particularly to a press-fit terminal connection structure in which a board connecting portion of a press-fit terminal is press-fit and connected to a through hole provided in a printed circuit board.

BACKGROUND ART

A press-fit terminal including a board connecting portion to be press-fit and connected to a through hole provided in a printed circuit board (PCB) is formed with a tin plating layer on a surface of the board connecting portion in many cases. If the tin plating layer of the press-fit terminal is scraped during insertion into the through hole, scraped tin (scrapings) possibly affects electrical connection between the press-fit terminal and the through hole, a circuit on a printed circuit board and the like.

Accordingly, in terms of suppressing the scraping of a metal layer on a surface of a board connecting portion of a press-fit terminal, improvements have been made for the composition of the metal layer and the shape of the board connecting portion. As an improvement for the composition of the metal plate, it is, for example, disclosed in patent literature 1 to successively provide a $Cu_3Sn$ alloy layer and a $Cu_6Sn_5$ alloy layer on a surface of a base material of a press-fit terminal via a plating underlayer and eliminate the exposure of Sn on a surface of the $Cu_6Sn_5$ alloy layer. By providing two types of alloy layers, scraping during press-fitting into the through hole is reduced, utilizing a hardness increase on the base material surface side.

CITATION LIST

Patent Literature

Patent literature 1: Japanese Unexamined Patent Publication No. 2010-262863

SUMMARY

Technical Problem

By using a hard metal layer as a metal layer provided on a surface of a board connecting portion of a press-fit terminal as in the above literature 1, it is possible to reduce surface friction during the insertion and withdrawal of the terminal and suppress scraping. Low surface friction during the insertion and withdrawal of the terminal is effective in reducing a load required to insert and withdraw the press-fit terminal. However, for the press-fit terminal, it is preferable not only to suppress scraping and reduce a necessary load during insertion into and withdrawal from the through hole, but also to exhibit a high holding force to prevent the press-fit terminal from easily coming out from the through hole at an unintended timing in a state inserted in the through hole. A metal layer used to exhibit a function of suppressing scraping and reducing a necessary load during the insertion and withdrawal of the press-fit terminal tends to be poor in an effect of enhancing the holding force of the press-fit terminal in the state inserted in the through hole.

Further, the press-fit terminal is inserted into and withdrawn from the through hole and held in the inserted state with a metal material of the surface of the press-fit terminal and a metal material of the inner peripheral surface of the through hole held in contact with each other. Thus, in suppressing scraping and reducing a necessary load during the insertion and withdrawal of the press-fit terminal and improving the holding force in the inserted state, it cannot be said to be sufficient to consider only the configuration of the metal layer formed on the surface of the press-fit terminal. The configuration of the metal layer formed on the inner peripheral surface of the through hole also needs to be considered.

An object certain aspects of certain embodiments is to provide a press-fit terminal connection structure in which a board connecting portion of a press-fit terminal is press-fit and connected to a through hole provided in a printed circuit board, and which can combine the suppression of scraping of a surface layer and a reduction of a load necessary for insertion and withdrawal when the press-fit terminal is inserted into and withdrawn from the through hole and an improvement of a holding force for keeping the press-fit terminal inserted in the through hole.

Solution to Problem

To achieve the above object, in a press-fit terminal connection structure according to a preferred embodiment, a board connecting portion of a press-fit terminal is press-fit into a through hole provided in a printed circuit board and the through hole and the press-fit terminal are electrically in contact with each other on contact point portions thereof, wherein the press-fit terminal includes, at least on a surface of the contact point portion, an alloy containing layer in which a domain structure of alloy parts made of an alloy mainly containing tin and palladium is present in a tin part made of pure tin or an alloy having a higher ratio of tin to palladium than the alloy parts and both the alloy parts and the tin part are exposed on an outermost surface, and the through hole includes a tin layer on an outermost surface of an inner peripheral surface including at least the contact point portion.

Here, a surface hardness of the alloy containing layer is preferably 120 Hv or higher and 380 Hv or lower.

A layer of contact oil is preferably not present on surfaces of the contact point portions of the press-fit terminal and the through hole.

Further, a maximum value of a friction coefficient between the inner peripheral surface of the through hole covered with the tin layer and the contact point portion of the press-fit terminal covered with the alloy containing layer may be larger when the press-fit terminal is withdrawn from the through hole than when the press-fit terminal is inserted into the through hole.

A difference between a maximum static friction coefficient and a dynamic friction coefficient between the inner peripheral surface of the through hole covered with the tin layer and the contact point portion of the press-fit terminal covered with the alloy containing layer may be 0.06 or larger. The maximum static friction coefficient between the inner peripheral surface of the through hole covered with the tin layer and the contact point portion of the press-fit terminal covered with the alloy containing layer may be 0.4 or larger. The dynamic friction coefficient between the inner peripheral surface of the through hole covered with the tin layer and the contact point portion of the press-fit terminal covered with the alloy containing layer may be below 0.4.

Further, a content of palladium in the alloy containing layer may be 2 atomic % or higher.

An underlayer made of nickel or nickel alloy may be provided between a base material constituting the press-fit terminal and the alloy containing layer.

Effects

In the above press-fit terminal connection structure according to a preferred embodiment, the alloy containing layer is formed on the surface of the board connecting portion of the press-fit terminal and the tin layer is formed on the inner peripheral surface of the through hole. Both the alloy parts made of the alloy mainly containing tin and palladium and the tin part made of pure tin or the alloy having a higher tin ratio to palladium than the alloy parts are exposed on the outermost surface of the alloy containing layer formed on the press-fit terminal side. Out of these, the alloy parts have a high effect of suppressing scraping and reducing a necessary load during the insertion and withdrawal of the press-fit terminal by reducing a dynamic friction coefficient on a contact part with the tin layer formed on the side of the through hole. On the other hand, the tin part functions to increase a static friction coefficient since the tin part exhibits a high adhesion force between same types of metals as tin on the contact part with the tin layer formed on the side of the through hole. As a result, with the press-fit terminal inserted in the through hole, a high holding force is obtained and it becomes more difficult to withdraw the press-fit terminal from the through hole. By appropriately selecting the configurations of the metal layers on the surfaces of both the press-fit terminal and the through hole in this way, the suppression of scraping of a metal material and a reduction of the necessary lad during insertion and withdrawal and an improvement of the holding force in the inserted state can be highly combined.

Here, if the surface hardness of the alloy containing layer is 120 Hv or higher and 380 Hv or lower, an amount of the hard alloy parts and an amount of the soft tin part capable of exhibiting a high effect of reducing the dynamic friction coefficient and improving the adhesion force are exposed on the surface of the alloy containing layer, whereby the hardness in the above range is achieved on the surface of the alloy containing layer. Thus, by setting the hardness in such a range, the suppression of scraping of the surface layer and a reduction of the necessary load during the insertion and withdrawal of the press-fit terminal and an improvement of the holding force with the press-fit terminal inserted in the through hole can be both effectively achieved. Particularly, a state where the maximum value of the friction coefficient is larger when the press-fit terminal is withdrawn from the through hole than when the press-fit terminal is inserted into the through hole is easily realized.

According to the press-fit terminal connection structure as described above, a high effect of suppressing plating cut on the side of the through hole by the tin part is obtained even if contact oil, which is conventionally generally used to suppress plating scraping and plating cut, is not used. By not using the contact oil, various influences caused by the use of the contact oil can be eliminated.

Further, if the maximum value of the friction coefficient between the inner peripheral surface of the through hole covered with the tin layer and the contact point portion of the press-fit terminal covered with the alloy containing layer is larger when the press-fit terminal is withdrawn from the through hole than when the press-fit terminal is inserted into the through hole, the press-fit terminal can be inserted into the through hole with a small force, whereby high workability can be obtained in insertion and a high holding force can be obtained in a state after insertion.

If the difference between the maximum static friction coefficient and the dynamic friction coefficient between the inner peripheral surface of the through hole covered with the tin layer and the contact point portion of the press-fit terminal covered with the alloy containing layer is 0.06 or larger, an increase of the holding force with the press-fit terminal inserted in the through hole by a large maximum static friction coefficient and the suppression of scraping and a reduction of the necessary load during insertion and withdrawal by a small dynamic friction coefficient can be effectively combined.

If the maximum static friction coefficient between the inner peripheral surface of the through hole covered with the tin layer and the contact point portion of the press-fit terminal covered with the alloy containing layer is 0.4 or larger, the holding force with the press-fit terminal inserted in the through hole can be particularly effectively increased.

If the dynamic friction coefficient between the inner peripheral surface of the through hole covered with the tin layer and the contact point portion of the press-fit terminal covered with the alloy containing layer is below 0.4, the suppression of scraping of the metal material and a reduction of the necessary load can be particularly effectively achieved when the press-fit terminal is inserted into and withdrawn from the through hole.

Further, if the content of palladium in the alloy containing layer is 2 atomic % or higher, an effect of making a difference between the maximum static friction coefficient and the dynamic friction coefficient larger by reducing the dynamic friction coefficient is particularly excellent.

If the underlayer made of nickel or nickel alloy is provided between the base material constituting the press-fit terminal and the alloy containing layer, adhesion to the base material of the alloy containing layer is enhanced and heat resistance of the alloy containing layer can be enhanced.

BRIEF DESCRIPTION OF THE DRAWINGS

FIG. 1 is a section along an axial direction showing a state where a press-fit terminal is not inserted in a through hole in a press-fit terminal connection structure according to one embodiment, FIG. 2 show a state where the press-fit terminal is inserted in the through hole in the press-fit terminal connection structure, wherein FIG. 7 is a graph showing a relationship of a maximum friction coefficient difference and a hardness of the alloy containing layer, FIG. 8 are pictures showing a state of a boundary part between a through hole and a press-fit terminal with the press-fit terminal inserted in the through hole having a tin layer formed on an inner peripheral surface, wherein FIG. 8(a) shows a case where an alloy containing layer is formed on the surface of the press-fit terminal, FIG. 8(b) shows a case where a thin tin layer is formed on the surface of the press-fit terminal, and FIG. 8(c) shows a case where a thick tin layer is formed on the surface of the press-fit terminal and contact oil is not used in the case shown in FIG. 8(a) and contact oil is used in the cases shown in FIGS. 8(b) and 8(c), and FIG. 9 are pictures showing a cross-section of the through hole in a state after a press-fit terminal is inserted into a through hole having a tin layer formed on an inner peripheral surface and withdrawn therefrom, wherein

EMBODIMENTS

Figure 1:
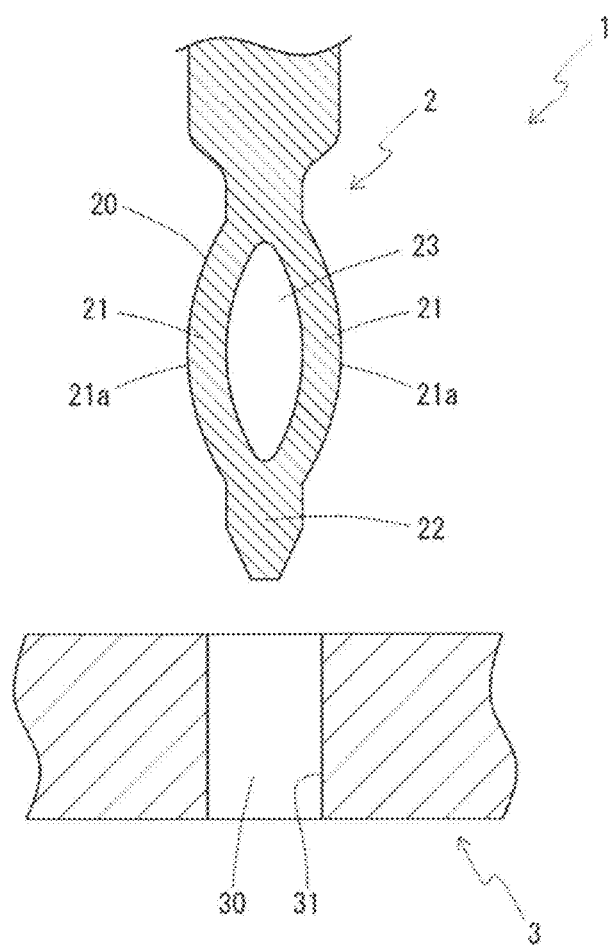

Hereinafter, a press-fit terminal connection structure according to one embodiment is described in detail using the drawings.

[Summary of Press-Fit Terminal Connection Structure]

First, a summary of a press-fit terminal connection structure 1 is described with reference to FIGS. 1 to 3. The press-fit terminal connection structure 1 is composed of a press-fit terminal 2 and a through hole 30 provided in a printed circuit board (PCB) 3. A board connecting portion 20 of the press-fit terminal 2 is press-fit into the through hole 30 of the printed circuit board 3, and the through hole 30 and the press-fit terminal 2 are electrically in contact with each other on contact point portions thereof.

A conductive path (not shown) having a predetermined pattern is formed on a surface of the printed circuit board 3. The through hole 30 is formed on the conductive path. A tin layer 3c to be described in detail later is formed on an inner peripheral surface 31 of the through hole 30 and serves as a conductive contact point portion. The inner peripheral surface 31 of the through hole 30 is electrically connected to the conductive path.

The press-fit terminal 2 is an electrical connection terminal shaped to be long and narrow as a whole and includes the board connecting portion 20 to be press-fit and connected to the through hole 30 of the printed circuit board 3 on one end and a terminal connecting portion (not shown) to be connected to a mating connection terminal by fitting or the like on the other end. By utilizing the press-fit terminal 2 including the board connecting portion 20 and the terminal connecting portion on the both ends, electrical connection can be formed between the printed circuit board 3 and the mating connection terminal via the press-fit terminal 2. A multitude of the press-fit terminals 2 are held side by side in a PCB connector in many cases.

The board connecting portion 20 includes a pair of bulging pieces 21, 21 in a part to be press-fit and connected to the through hole 30. The bulging pieces 21, 21 are shaped to arcuately bulge out away from each other in directions perpendicular to an axial direction (vertical direction of FIG. 1) of the press-fit terminal 2. Top parts most projecting outward on outer side surfaces in bulging directions of the bulging pieces 21, 21 serve as contact point portions 21a, 21a to be brought into contact with the inner peripheral surface 31 of the through hole 30. A maximum radial length of the pair of bulging pieces 21, 21 (maximum distance between the pair of contact point portions 21a, 21a) is larger than an inner diameter of the through hole 30.

A gap 23 is formed between the pair of bulging pieces 21, 21. By the presence of this gap 23, the pair of bulging pieces 21, 21 are radially pressed to be compressed and resiliently deformed when the press-fit terminal 2 is inserted into the through hole 30 as shown in FIG. 2. The bulging pieces 21, 21 are resiliently restored by resilient components thereof and kept in contact with the contact point portion on the inner peripheral surface 31 of the through hole 30. A tapered guiding portion 22 is formed on a side closer to a tip than the bulging pieces 21, 21 of the board connecting portion 20, and functions to guide the board connecting portion 20 into the through hole 30.

[Material Compositions of Press-Fit Terminal and Through Hole]

Next, materials constituting the press-fit terminal 2 and the through hole 30 of the printed circuit board 3 are described.

(1) Through Hole

The tin layer 3c is formed on the entire inner peripheral surface 31 of the through hole 30 and exposed on an outermost surface. That is, as schematically shown in a section of FIG. 3(a), the tin layer 3c is appropriately formed on a surface of a base material 3a constituting the printed circuit board 3 across a copper underlayer 3b. A surface of the tin layer 3c serves as the inner peripheral surface 31 of the through hole 30.

The tin layer 3c is made of pure tin or tin alloy mainly containing tin. In the case of tin alloy, a content of metal elements other than tin is preferably less than a content of palladium in alloy parts 2c1 (tin-palladium alloy) included in the alloy containing layer 2c of the press-fit terminal 2 to be described next.

The copper underlayer 3b and the tin layer 3c may be successively formed by lamination, for example, by a known plating method. Thicknesses of the copper underlayer 3b and the tin layer 3c are not particularly specified, but the thickness of the tin layer 3c is preferably a thickness sufficient to exhibit properties obtained as original tin properties such as high connection reliability and a high maximum static friction coefficient (hereinafter, may be merely referred to as a static friction coefficient) with the press-fit terminal 2 and is, for example, 0.1 µm or larger. Further, this thickness is preferably 10.0 µm or smaller in terms of shortening a plating time to the circuit board 3. However, in the through hole 30 of the printed circuit board 3, it is normally difficult to freely change a thickness of a metal layer.

Note that the tin layer 3c (and copper underlayer 3b) may be provided only on the contact point portion to be possibly brought into contact with the contact point portions 21a, 21a of the press-fit terminal 2 out of the inner peripheral surface 31 of the through hole 30 in terms of effectively contributing to the insertion and withdrawal of the press-fit terminal 2 and the holding of the press-fit terminal 2 in an inserted state. However, a metal layer of this type is normally provided on the entire inner peripheral surface 31 of the through hole 30. An organic film may be formed on the surface of the tin layer 3c by a preflux processing or the like without largely changing properties of the tin layer 3 in the insertion and withdrawal of the press-fit terminal 2 and the holding of the press-fit terminal 2 in the inserted state.

(2) Press-Fit Terminal

The alloy containing layer 2c is exposed on the outermost surface of the surface of the press-fit terminal 2. That is, as a schematic diagram of a cross-section is shown in FIG. 3(b), the alloy containing layer 2c is appropriately formed on a surface of a base formed from a base material 2a such as copper or copper alloy constituting the press-fit terminal 2 across a nickel underlayer 2b.

The alloy containing layer 2c is composed of the alloy parts 2c1 made of an alloy mainly containing tin and palladium and a tin part 2c2 made of pure tin or an alloy having a higher tin content than in the alloy parts 2c1. The alloy parts 2c1 are segregated in the tin part 2c2 to form a three-dimensional domain-like (island-like, cluster-like) structure. The alloy parts 2c1 are mainly made of a tin-palladium alloy in which tin and palladium form an alloy at a specific composition ratio. However, a small amount of phases of nickel constituting the nickel underlayer 2b, metal elements constituting the base material 2a, unavoidable impurities, palladium not taken into the alloy and the like may be contained in the alloy. Particularly, in the case of using the nickel underlayer 2b, the alloy containing layer 2c may be made of an intermetallic compound containing nickel in addition to tin and palladium.

The alloy parts 2c1 and the tin part 2c2 are both exposed on the outermost surface of the alloy containing layer 2c. A tin-palladium alloy containing layer disclosed in International Publication No. 2013/168764 filed by the present applicant and entirely incorporated herein by reference can be suitably used as the alloy containing layer 2c. A particularly preferable form is briefly described below.

As described in detail later, the alloy parts 2c1 exposed on the outermost surface in the alloy containing layer 2c function to reduce a dynamic friction coefficient with the tin layer 3c of the inner peripheral surface 31 of the through hole 30, and the tin part 2c2 exposed on the outermost surface functions to increase the static friction coefficient. In terms of effectively achieving a reduction of the dynamic friction coefficient by the alloy parts 2c1, a content of palladium (Pd/(Pd+Sn)) is preferably 1 atomic % or higher, particularly preferably 2 atomic % or higher, further preferably 3 atomic % or higher and even more preferably 4 atomic % or higher in the entire alloy containing layer 2c, i.e. in the entire region of the alloy containing layer 2c as the sum of the alloy parts 2c1 and the tin part 2c2. On the other hand, the tin-palladium alloy is known to form a stable intermetallic compound made of $PdSn_4$, and the content of palladium is preferably below 20 atomic % in terms of constituting the alloy parts 2c1 occupying parts of the alloy containing layer 2c mainly by this intermetallic compound (or intermetallic component having palladium partially substituted by nickel). Further, in terms of sufficiently ensuring the tin part 2c2 and effectively achieving an increase of the static friction coefficient by the tin part 2c2, an upper limit value of the content of palladium is more preferably 7 atomic %.

Further, in terms of effectively reducing the dynamic friction coefficient with the tin layer 3c of the through hole 30, an exposed area ratio of the alloy parts 2c1 occupying the surface of the alloy containing layer 2c is preferably 10% or higher and more preferably 20% or higher. Note that the exposed area ratio of the alloy parts 2c1 is calculated by (area of alloy parts 2c1 exposed on the surface)/(area of the entire surface of the alloy containing layer 2c)×100(%).

Further, in terms of sufficiently exhibiting proprieties of the alloy containing layer 2c to increase the static friction coefficient while reducing the dynamic friction coefficient with the tin layer 3c of the through hole 30, a thickness of the entire alloy containing layer 2c is preferably 0.1 μm or larger. Further, in terms of suppressing cost required to form the alloy containing layer 2c, the thickness of the entire alloy containing layer 2c is preferably 10 μm or smaller.

The nickel underlayer 2b is made of nickel or nickel alloy and functions to enhance the adhesion of the alloy containing layer 2c to the base material 2a and suppress the diffusion of copper atoms from the base material 2a to the alloy containing layer 2c. Out of the nickel underlayer 2b, a part on the side of the alloy containing layer 2c may be formed into a nickel-tin alloy layer 2b2 by heating in a process of forming the alloy containing layer 2c to be described later. A remaining part of the nickel underlayer 2b serves as a nickel layer 2b1 not to be alloyed with tin.

The alloy containing layer 2c can be formed, for example, by laminating a palladium plating layer and a tin plating layer in this order on the surface of the base material 2a or the surface of the nickel underlayer 2b and alloying these layers by heating. Alternatively, the alloy containing layer 2c may be formed by eutectoid using a plating solution containing both tin and palladium. In terms of easiness, the former method of alloying the laminated palladium plating layer and tin plating layer is preferable. By adjusting a heating temperature and a heating time in alloying, the exposed area ratio of the alloy parts 2c1 can be controlled.

Thicknesses of the tin plating layer and the palladium plating layer may be appropriately determined in consideration of a thickness of the alloy containing layer 2c desired to be finally formed, the content of palladium, the exposed area ratios of the alloy parts 2c1 and the tin part 2c2, the hardness of the alloy containing layer 2c and the like. For example, a mode in which the thickness of the tin plating layer is 1.0 to 1.5 μm and the thickness of the palladium plating layer is 0.02 to 0.03 μm can be illustrated.

Note that the alloy containing layer 2c (and nickel underlayer 2b) may be provided only on the surfaces of the contact point portions 21a, 21a in terms of contributing to insertion into and withdrawal from the through hole 30 and the holding of the press-fit terminal 2 in the inserted state. However, in terms of facilitating the manufacturing of the press-fit terminal and the like, the alloy containing layer 2c may be provided on the entire board connecting portion 20 and further the entire press-fit terminal 2 including up to the terminal connecting portion. The press-fit terminal 2 can be manufacturing by stamping from a plate material having the alloy containing layer 2c (and nickel underlayer 2b) formed on the surface of the base material 2a.

[Hardness of Alloy Containing Layer]

Here, a relationship between a surface hardness of the alloy containing layer 2c and behaviors in inserting and withdrawing the press-fit terminal 2 into and from the through hole 30 and holding the press-fit terminal 2 in the through hole 30 is described. Note that the surface hardness of the alloy containing layer 2c is a hardness measured in an entire actual contact surface of the alloy containing layer 2c of the press-fit terminal 2 actually in contact with the tin layer 3c on the inner peripheral surface 31 of the through hole 30, i.e. a hardness (apparent hardness) measured for a surface including both alloy parts 2c1 and the tin part 2c2 exposed together.

When the board connecting portion 20 of the press-fit terminal 2 having the exposed alloy containing layer 2c is inserted into the through hole 30 having the tin layer 3c exposed on the inner peripheral surface 31, the metal material on the surface of the alloy containing layer 2c is partially abraded to form layers having an adhesion force on interfaces between the contact point portions 21a, 21a and the inner peripheral surface 31 of the through hole.

A possibility of abrasion of the metal material is known to be expressed by the following Equation (1).

$$V=(k/H)WL \tag{1}$$

Here, V denotes an abrasion volume, k denotes an abrasion coefficient, H denotes a hardness, W denotes a load and L denotes a sliding distance.

As expressed in Equation (1), a possibility of abrasion on the alloy containing layer 2c (abrasion volume V) is inversely proportional to the hardness H. That is, as the surface hardness of the alloy containing layer 2c decreases, abrasion is more likely to occur and the layers having the adhesion force as described above are more easily formed. With the board connecting portion 20 of the press-fit terminal 2 inserted in the through hole 30, a holding force of the press-fit terminal 2 in the through hole 30 increases and the press-fit terminal 2 is less likely to be detached from the through hole 30 if such layers are formed and adhesion occurs between the alloy containing layer 2c and the tin layer 3c in contact with each other. As described above, the tin part 2c2 has a low hardness and is more susceptible to adhesion between the same type of metals to the tin layer 3c on the side of the through hole 30, wherefore the tin part 2c2 centrally contributes to an improvement of the holding force by forming the layers having the adhesion force on the surface of the alloy containing layer 2c.

On the other hand, on the surface of the alloy containing layer 2c, a main cause for a dynamic friction force is adhesive friction, which is known to be expressed by the following Equation (2).

$$Fs=(s/H)W \tag{2}$$

Here, Fs denotes an adhesive friction force, s denotes a shear strength, H denotes a hardness and W denotes a load.

As expressed by Equation (2), the adhesive friction force Fs is inversely proportional to the hardness H. That is, as the surface hardness of the alloy containing layer 2c decreases, the dynamic friction coefficient due to the adhesive friction becomes higher. If the dynamic friction coefficient between the alloy containing layer 2c of the press-fit terminal 2 and the tin layer 3c of the through hole 30 increases, the material is more likely to be scraped and the load necessary for insertion and withdrawal becomes larger when the press-fit terminal 2 is inserted into and withdrawn from the through hole 30. As described above, the alloy parts 2c1 have a high hardness and act to reduce the dynamic friction coefficient by the adhesive friction on the surface of the alloy containing layer 2c. As a result, the alloy parts 2c1 centrally contribute to the suppression of scraping and a reduction of the necessary load during the insertion and withdrawal of the press-fit terminal 2.

As just described, as the surface hardness of the alloy containing layer 2c decreases, the holding force of the press-fit terminal 2 in the through hole 30 increases. On the other hand, as the hardness of the alloy containing layer 2c increases, it is more easily achieved to suppress scraping and reduce the necessary load during the insertion and withdrawal of the press-fit terminal 2 into and from the through hole 30. Accordingly, if the surface hardness of the alloy containing layer 2c is, for example, set to be 120 Hv or higher and 380 Hv or lower, an improvement of the holding force and the suppression of scraping and a reduction of the necessary load during insertion and withdrawal can be combined in a well-balanced manner. In other words, the hardness of the alloy containing layer 2c in the range as described above means that the alloy parts 2c1 having a high hardness and capable of reducing the dynamic friction coefficient on the surface and the tin part 2c2 having a low hardness and capable of increasing the static friction coefficient by adhesion to the tin layer 3c are both exposed on the outermost surface respectively in areas sufficient to exhibit the functions thereof. As a result, a reduction of the dynamic friction coefficient and an improvement of the static friction coefficient can be combined. The hardness of the alloy containing layer 2c is preferably 150 Hv or higher, more preferably 200 Hv or higher, further preferably 350 Hv or higher and even more preferably 300 Hv or higher.

As described above, the hardness of the alloy containing layer 2c depends on a ratio of the alloy parts 2c and the tin part 2c2 exposed on the surface of the alloy containing layer 2c (exposed area ratio) and the exposed area ratio can be, for example, controlled by a thickness ratio of the tin layer and the palladium layer in forming the alloy containing layer 2c. Roughly speaking, the ratio of the alloy parts 2c to the alloy containing layer 2c increases and the hardness increases by increasing the ratio of the palladium layer. Further, the hardness of the alloy containing layer 2c also depends on the heating temperature and the heating time when the tin layer and the palladium layer are laminated and heated.

[Behaviors of Friction]

(1) Dynamic Friction Coefficient and Static Friction Coefficient

Behaviors of friction between the contact point portions 21a, 21a of the board connecting portion 20 of the press-fit terminal 2 on which the alloy containing layer 2c composed of the alloy parts 2c1 and the tin part 2c2 is exposed and the contact point portion of the inner peripheral surface 31 of the through hole 30 on which the tin layer 3c is exposed can be evaluated as follows.

Figure 2:
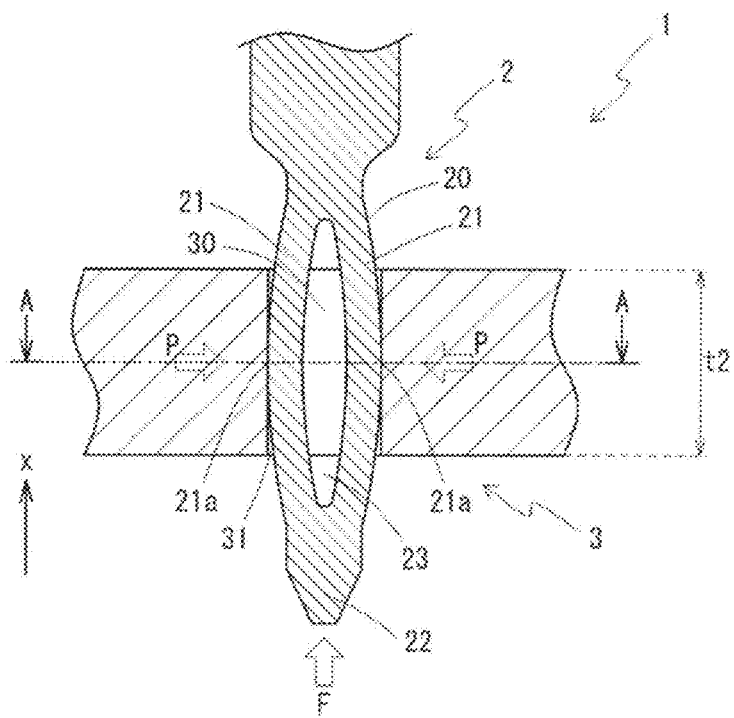
FIG. 2(a) is a section along the axial direction and FIG. 2(b) is a section along A-A in FIG. 2(a), FIGS. 3(a) and 3(b) are sections showing an inner peripheral surface of the through hole and a layer configuration on a surface of the press-fit terminal.
Figure 2:
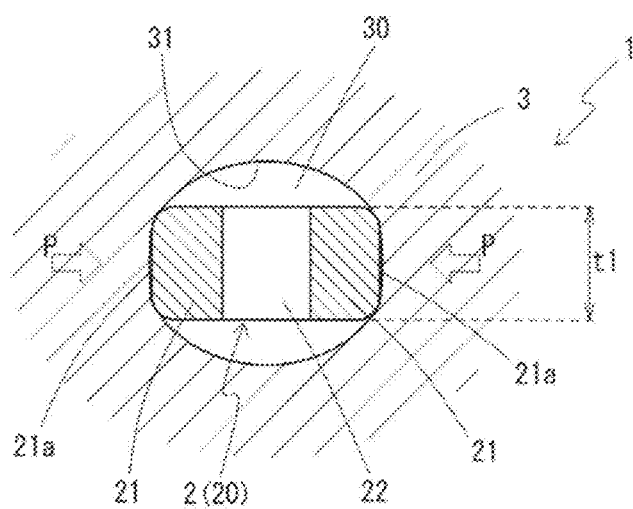
Figure 3:
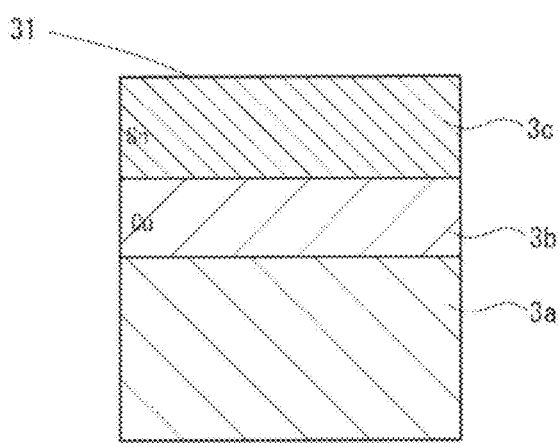
Figure 3:
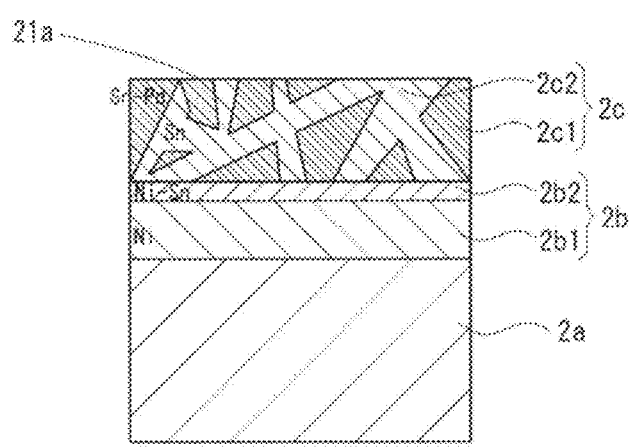

That is, as shown in FIG. 2, the board connecting portion 20 of the press-fit terminal 2 or a pin configured as a model extracting only the board connecting portion 20 is prepared in a state inserted in the through hole 30. Then, a load F applied from a tip side to a base end side is measured along the axial direction of the press-fit terminal 2 while the press-fit terminal 2 is displaced in a direction to come out from the through hole 30 along the axial direction. Then, the applied load F is recorded as a function of a displacement x of the press-fit terminal 2.

Figure 4:
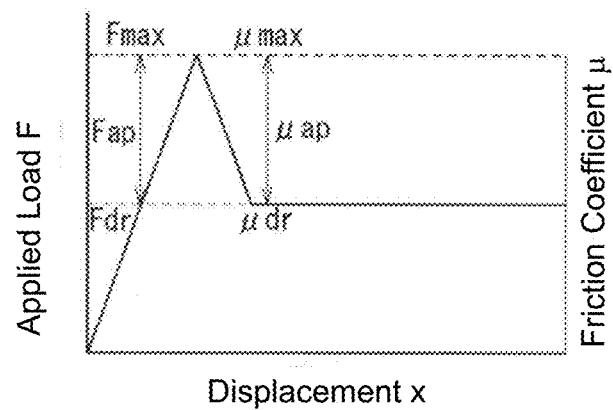
FIG. 4 is a graph schematically showing a relationship of an applied load, a friction coefficient and a displacement amount when the press-fit terminal is withdrawn from the through hole, FIG. 5 are graphs showing measurement results of a relationship of a load and a displacement when a tin layer is formed on the inner peripheral surface of the through hole, wherein FIGS. 5(a) to 5(c) correspond to Examples 1 to 3 formed with an alloy containing layer on the press-fit terminal, each alloy containing layer having a different content of palladium, and FIGS. 5(d) to 5(f) correspond to Comparative Examples 1 to 3 each formed with one of various alloy layers on the press-fit terminal, FIG. 6 are graphs showing measurement results of a relationship of a load and a displacement when an alloy containing layer is formed on the press-fit terminal and a silver or copper layer is formed on the inner peripheral surface of the through hole, wherein FIGS. 6(a) to 6(c) correspond to Comparative Examples 4 to 6 formed with the silver layer on the inner peripheral surface of the through hole, and FIGS. 6(d) to 6(f) correspond to Comparative Examples 7 to 9 formed with the copper layer on the inner peripheral surface of the through hole, each alloy containing layer having a different content of palladium.

If a relationship of the applied load F and the displacement x is plotted, the relationship is as shown in FIG. 4. In a region where the displacement x is small, the load F increases with a large gradient with respect to the displacement amount x. In other words, even if the load F is applied, the press-fit terminal 2 is hardly displaced. After reaching a maximum value Fmax, the load F suddenly drops and has a substantially constant value with respect to the displacement x (Fdr). The maximum value Fmax of the load F corresponds to the holding force of the press-fit terminal 2 in the through hole 30. Further, Fap, which is a difference corresponding to a drop between the maximum value Fmax and a value Fdr in a flat area, is a peak height in withdrawing the press-fit terminal 2.

Here, a value of the load F can be converted into a friction coefficient μ between the contact point portions 21a, 21a of the press-fit terminal 2 and the inner peripheral surface 31 of the through hole 30. That is, as shown in FIG. 2, a force applied from the inner peripheral surface 31 of the through hole 30 to one bulging piece 21 in a direction perpendicular to an axis of the press-fit terminal 2 is a contact load P, and the friction coefficient μ can be obtained as in the following Example (3), using the contact load P. Note that the contact load P is a quantity corresponding to the load W of the above Equations (1), (2).

$$\mu = F/2P \tag{3}$$

If the diameter of the through hole 30 is constant, the contact load P does not substantially change during the displacement of the press-fit terminal 2. Thus, a linear relationship is maintained between the friction coefficient μ and the applied load F and the behavior of the friction coefficient μ with respect to the displacement x is in the same pattern as the behavior of the applied load F as shown in FIG. 4. Here, a maximum value μmax of the friction coefficient μ corresponds to a maximum static friction coefficient. A flat friction coefficient μdr after a sudden drop corresponds to the dynamic friction coefficient. A drop amount μap corresponds to a difference between the maximum static friction coefficient and the dynamic friction coefficient.

Both the alloy parts 2c1 and the tin part 2c2 of the alloy containing layer 2c are exposed on the outermost surfaces of the contact point portions 21a, 21a in the press-fit terminal 2 described above. Out of these, the alloy parts 2c1 exhibit a very low dynamic friction coefficient μdr with the tin layer 3c on the inner peripheral surface 31 of the through hole 30 due to effects brought about by the hardness thereof and the like. As a result, the surface of the press-fit terminal 2 is unlikely to be scraped in inserting and withdrawing the press-fit terminal 2 into and from the through hole 30. Further, a force required to insert/withdraw the press-fit terminal 2 can be small. On the other hand, the tin part 2c2 has a soft surface and is susceptible to adhesion to the tin layer 3c on the inner peripheral surface 31 of the through hole 30, which is a layer made of the same type of metal. Thus, with the press-fit terminal 2 inserted in the through hole 30, adhesion occurs between the surface of the press-fit terminal 2 and the inner peripheral surface 31 of the through hole 30. As a result, a shear force in detaching the press-fit terminal 2 from the through hole 30 increases and the maximum static friction coefficient μmax increases. Then, the holding force of the press-fit terminal 2 in the through hole 30 increases.

As just described, a press-fit terminal including the alloy containing layer 2c having the tin part 2c2 and the alloy parts 2c1 both exposed on the outermost surface is used as the press-fit terminal 2 to be combined with the through hole 30 having the tin layer 3c on the inner peripheral surface 31, whereby the suppression of scraping and a reduction of the necessary load during insertion and withdrawal due to the low dynamic friction coefficient μdr and an improvement of the holding force in the inserted state due to the high maximum static friction coefficient μmax can be combined. Since the difference μap between the maximum static friction coefficient μmax and the dynamic friction coefficient μdr is large, the peak (Fap) of the load F in detaching the press-fit terminal 2 from the through hole 30 becomes larger and the avoidance of unintended detachment and the assistance of intended detachment (removal) are combined.

Such a combination of the low dynamic friction coefficient and the high static friction coefficient is achieved by adopting a specific combination of using the alloy containing layer 2c having both the alloy parts 2c1 and the tin part 2c2 exposed on the outermost surface on the side of the press-fit terminal 2 and using the tin layer 3c, which is a layer made of the same type of metal as the tin part 2c2 constituting the alloy containing layer 2c, on the side of the through hole 30. If even either one of the press-fit terminal 2 and the through hole 30 has a metal layer made of a different type of metal on the surface, similar behaviors are difficult to achieve for friction. Generally, typical examples of a metal layer formed on an inner peripheral surface of a through hole of a printed circuit board include a tin layer, a silver layer and a copper layer. As also described in Examples later, the high static friction coefficient and the low dynamic friction coefficient cannot be combined even if the press-fit terminal 2 having the alloy containing layer 2c as described above is used in combination with a through hole having a silver or copper layer. On the contrary, even if another type of alloy having no such structure that an area of pure tin or an alloy having a high tin content like the tin part 2c2 is mixed in areas having a high hardness like the alloy parts 2c1 is used on a surface of a press-fit terminal when the tin layer 3c is formed on the inner peripheral surface 31 of the through hole 30, the high static friction coefficient and the low dynamic friction coefficient cannot be combined. For example, a tin-silver alloy, a tin-lead alloy, a tin-copper alloy and the like form an alloy layer having a high homogeneity in the layer and do not coexist with a domain-like tin part, wherefore an effect of reducing the friction coefficients is excellent, but the static friction coefficient is also reduced.

In terms of sufficiently obtaining an effect of suppressing scraping and reducing the necessary load during the insertion and withdrawal of the press-fit terminal 2, the dynamic friction coefficient μdr is preferably below 0.4 and further preferably 0.3 or lower. On the other hand, in terms of sufficiently obtaining an effect of improving the holding force in the inserted state, the maximum static friction coefficient μmax is preferably 0.4 or higher and more preferably 0.45 or higher. Further, the difference μap between the maximum static friction coefficient μmax and the dynamic friction coefficient μdr is preferably 0.06 or larger and more preferably 0.10 or larger.

(2) Insertion-Time Maximum Friction Coefficient and Withdrawal-Time Maximum Friction Coefficient It is described above to use the static friction coefficient and the dynamic friction coefficient between the alloy containing layer 2c of the press-fit terminal 2 and the tin layer 3c of the through hole 30 as indices for combining a large holding force of the press-fit terminal 2 in the through hole 30 and a reduction of the necessary load during insertion and withdrawal. However, other indices can also be used instead of those static friction coefficient and dynamic friction coefficient.

That is, a maximum value of a friction coefficient in inserting the press-fit terminal 2 into the through hole 30 (insertion-time maximum friction coefficient) and a maximum value of a friction coefficient in withdrawing the press-fit terminal 2 from the through hole 30 (withdrawal-time maximum friction coefficient) can be used as indices. If the withdrawal-time maximum friction coefficient is set higher than the insertion-time maximum friction coefficient, a large holding force of the press-fit terminal 2 in the through hole 30 and a reduction of the necessary load during insertion and withdrawal can be effectively combined. In other words, a maximum friction coefficient difference expressed as a difference obtained by subtracting a value of the insertion-time maximum friction coefficient from a value of the withdrawal-time maximum friction coefficient (withdrawal-time maximum friction coefficient—insertion-time maximum friction coefficient) is a positive value.

As the insertion-time maximum friction coefficient decreases, a smaller force is required in inserting the press-fit terminal 2 into the through hole 30. As a result, workability at the time of inserting the press-fit terminal 2 is improved. On the other hand, as the withdrawal-time maximum friction coefficient increases, a larger force is required in withdrawing the press-fit terminal 2 from the through hole 30. Thus, the holding force of the press-fit terminal 2 in the through hole 30 increases. As a result, the press-fit terminal 2 can be firmly kept inserted in the through hole 30. By ensuring a relationship that the withdrawal-time maximum friction coefficient is larger than the insertion-time maximum friction coefficient, the effects thereof are more easily combined. If a ratio of the maximum friction coefficient difference to the insertion-time maximum friction coefficient (maximum friction coefficient difference/insertion-time maximum friction coefficient) is 3% or higher, further 5% or higher, those effects are particularly well combined.

Here, the insertion-time maximum friction coefficient and the withdrawal-time maximum friction coefficient are values when the press-fit terminal 2 is moved in the axial direction with respect to the through hole 30 and the friction coefficient is maximized in the entire process of insertion or withdrawal, and multiple phenomena can give the maximum friction coefficients during insertion and withdrawal, such as, due to the fact that the states of the press-fit terminal 2 and the through hole 30 are not constant throughout the process of insertion or withdrawal. However, the insertion-time maximum friction coefficient should be strongly positively correlated with the dynamic friction coefficient between the alloy containing layer 2c of the press-fit terminal 2 and the tin layer 3c of the through hole 30, and the withdrawal-time maximum friction coefficient should be strongly positively correlated with the maximum static friction coefficient between them. Thus, the dynamic friction coefficient between the surfaces is said to decrease as the insertion-time maximum friction coefficient decreases. On the other hand, the maximum static friction coefficient between the surfaces is said to increase as the withdrawal-time maximum friction coefficient increases.

A magnitude relationship of the insertion-time maximum friction coefficient and the withdrawal-time maximum friction coefficient changes in dependence on a surface state of the alloy containing layer 2c. However, as shown in Examples later, the relationship that the withdrawal-time maximum friction coefficient is larger than the insertion-time maximum friction coefficient is more easily obtained when the surface hardness of the alloy containing layer 2c is in the range of 120 to 380 Hv described as preferable values above. As shown in Examples, the maximum friction coefficient difference (withdrawal-time maximum friction coefficient—insertion-time maximum friction coefficient) exhibits such a behavior as to have a local maximum with respect to the hardness of the alloy containing layer 2c. Both the withdrawal-time maximum friction coefficient and the insertion-time maximum friction coefficient exhibit such a behavior as to have a smaller value as the surface hardness increases. However, since the insertion-time maximum friction coefficient is more dependent on the surface hardness, the maximum friction coefficient difference is thought to exhibit a behavior having such a local maximum.

The values of the insertion-time maximum friction coefficient and the withdrawal-time maximum friction coefficient possibly change in dependence on factors including histories such as the number of insertion and withdrawal and an order of evaluations, but the magnitude relationship between the both maximum friction coefficients itself hardly depends on those factors. Further, the press-fit terminal 2 may be withdrawn and the withdrawal-time maximum friction coefficient may be measured immediately after the press-fit terminal 2 is inserted into the through hole 30. However, to precisely evaluate a phenomenon that the withdrawal-time maximum friction coefficient increases and the holding force is improved as adhesion between the alloy containing layer 2c and the tin layer 3c progresses, it is better to measure the withdrawal-time maximum friction coefficient after the press-fit terminal 2 is left inserted in the through hole 20 for a while. A standing time may be so set that adhesion sufficiently progresses, and 24 hours or more can be illustrated.

[Elimination of Contact Oil]

Conventionally, in a general press-fit terminal, contact oil is applied to surfaces in many cases to impart lubricity before insertion into a through hole and suppress plating scraping of the press-fit terminal and plating cut of the through hole. However, in the press-fit terminal connection structure 1 according to this embodiment, it is preferred not to use contact oil and not to provide a layer of contact oil on the both surfaces of the contact point portions 21a, 21a of the press-fit terminal 2 and the inner peripheral surface 31 of the through hole 30.

As described above, in the press-fit terminal connection structure 1 according to this embodiment, the alloy containing layer 2c having both the alloy parts 2c1 and the tin part 2c2 exposed on the outermost surface is formed on the surface of the press-fit terminal 2, and the tin layer 3c is exposed on the inner peripheral surface 31 of the through hole 30. Since the hard alloy parts 2c1 are exposed on the outermost surface of the press-fit terminal 2, it is effectively suppressed that the material of the surface of the press-fit terminal 2 is scraped (plating scraping) when the press-fit terminal 2 is inserted into and withdrawn from the through hole 30. On the other hand, since the soft tin part 2c2 is exposed on the outermost surface, it is also effectively suppressed that the tin layer 3c on the inner inner peripheral surface 31 of the through hole 30 is removed (plating cut) by friction with the hard surface when the press-fit terminal 2 is inserted into and withdrawn from the through hole 30.

As just described, by adopting a combination of the alloy containing layer 2c provided on the surface of the press-fit terminal 2 and the tin layer 3c provided on the inner peripheral surface 31 of the through hole 30, both the plating scraping on the side of the press-fit terminal 2 and the plating cut on the side of the through hole 30 can be sufficiently suppressed even without applying any contact oil. In the case of applying contact oil, cost and labor are required for application itself and for the management of a wetting degree by application. Further, the contact oil present in an electrical contact part between the press-fit terminal and the through hole may possibly affect connection reliability. Furthermore, dust easily adheres to the surface applied with the contact oil, and the adhering dust may possibly affect connection reliability. These events occurring due to the application of the contact oil can be eliminated by using no contact oil.

EXAMPLES

Examples and Comparative Example are described below. Note that the present invention is not limited by these Examples.

[Test A: Evaluation of Dynamic Friction Coefficient and Static Friction Coefficient]

[Fabrication of Samples]

(1) Examples 1 to 3

Press-fit pins (needle-eye type, thickness t1=0.6 mm) manufactured to have the shape of the board connecting portion of the press-fit terminal as shown in FIGS. 1 and 2 were prepared, and nickel underlayers were formed and tin-palladium alloy containing layers were formed on the nickel underlayers. In forming the alloy containing layer, a palladium layer and a tin layer were laminated in this order, and heated at 300° C. Thicknesses of the tin layer and the palladium layer were changed in Examples 1 to 3. Actually measured thickness values are shown in Table 1 below.

Further, a printed circuit board having tin plating applied to inner peripheral surfaces of through holes was prepared. The printed circuit board was made of a FR-4 material and the through holes had an inner diameter $\phi$ of 1.09 mm and a depth t2 of 1.6 mm. A tin layer having a thickness of 0.6 to 0.8 μm was formed on a Cu underlayer having a thickness of 25 to 35 μm on the inner peripheral surface of the through hole.

(2) Comparative Examples 1 to 3

Press-fit pins formed with a tin-silver alloy layer, a tin-lead alloy layer and a tin-copper alloy layer instead of the tin-palladium alloy containing layers of Examples 1 to 3 were prepared as samples of Comparative Example 1 to 3. Through holes having tin plating applied to inner peripheral surface as in Examples 1 to 3 were used as the through holes.

(3) Comparative Examples 4 to 6

Press-fit pins formed with the same tin-palladium alloy containing layers as those used in Examples 1 to 3 were used as press-fit pins used in Comparative Example 4 to 6. A silver layer having a thickness of 0.1 to 0.3 μm was formed on a Cu underlayer having a thickness of 25 to 35 μm on the inner peripheral surface of the through hole.

(4) Comparative Examples 7 to 9

Press-fit pins formed with the same tin-palladium alloy containing layers as those used in Examples 1 to 3 were used as press-fit pins used in Comparative Example 7 to 9. A Cu layer having a thickness of 25 to 35 μm was formed on an inner peripheral surface of a through hole by a preflux processing.

[Measurement of Load During Terminal Withdrawal]

The press-fit pin was inserted into the through hole for each of the samples according to Examples and Comparative Example. While the press-fit pin was displaced in a direction to be withdrawn from the through hole along an axial direction, a load applied to the press-fit pin was measured using a load cell. A measurement was conducted five times with the sample exchanged for each of Examples and Comparative Example. Note that, in this test, contact oil was not used in any of Examples and Comparative Example.

[Test Results]

Figure 5:
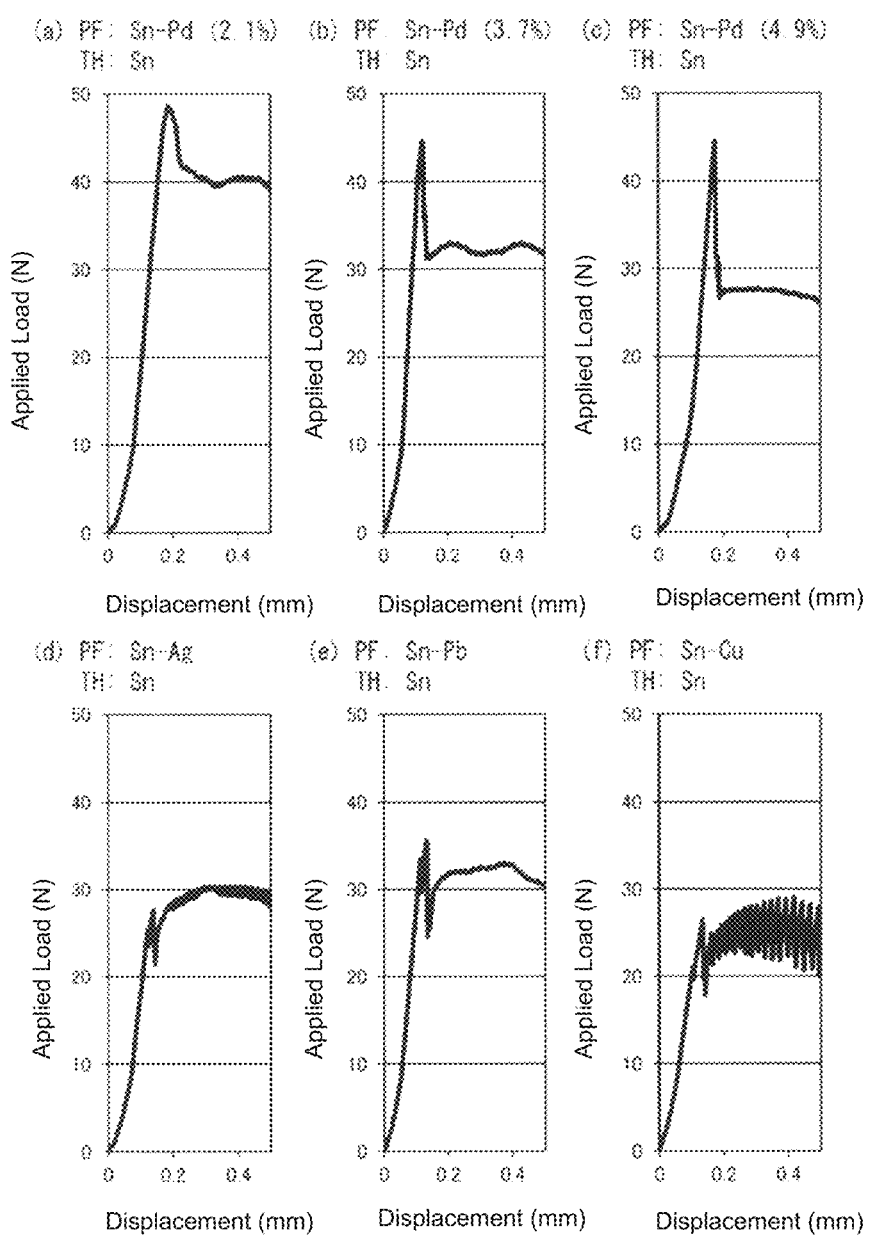
Figure 6:
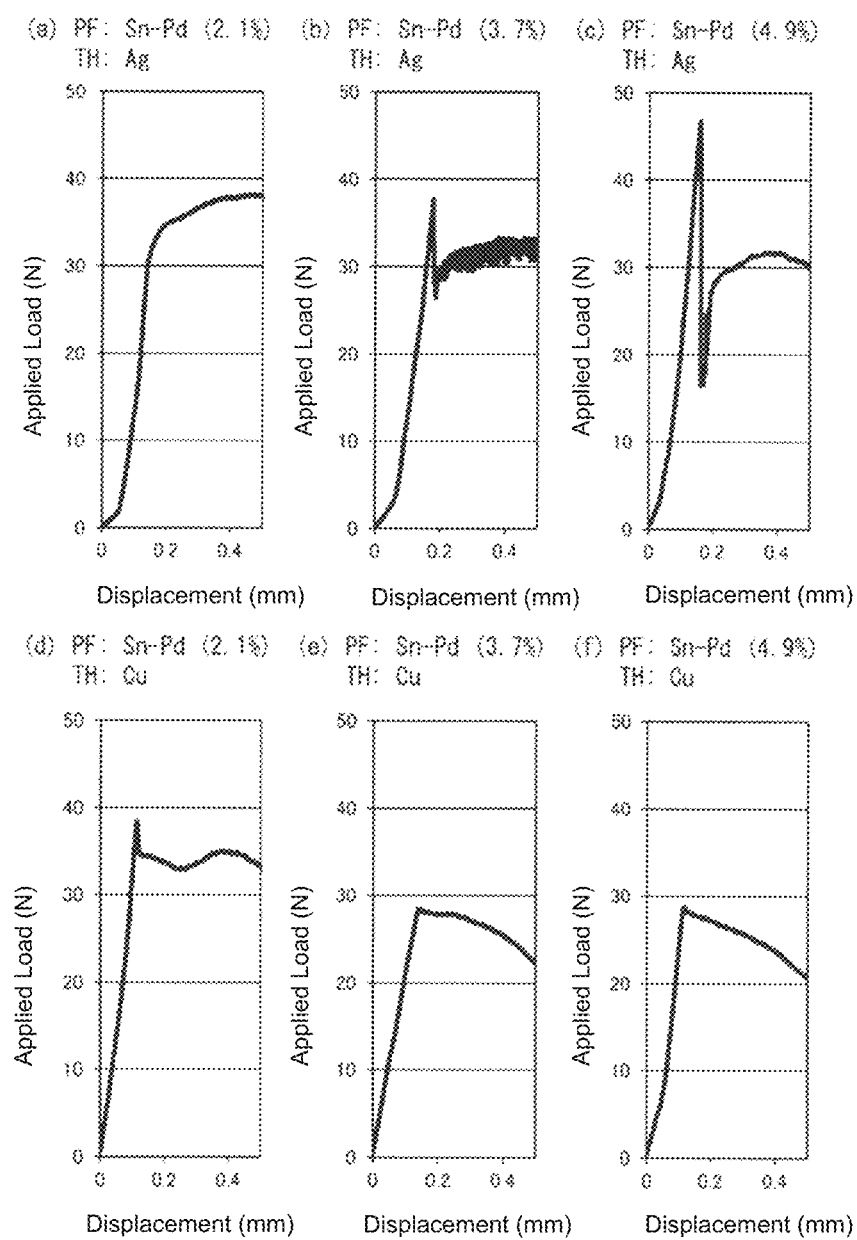

Measurement results of a relationship of a load and a displacement amount during terminal withdrawal are shown for Examples 1 to 3 and Comparative Example 1 to 9 in FIGS. 5 and 6. The listed results are representative examples out of five measurements.

Further, measurement results of a load and friction coefficients are summarized in Table 1 for Examples 1 to 3 and Comparative Example 1 to 3 using the through holes having the tin layer formed on the inner peripheral surface. Each of listed values is an average value in five measurements. Here, the friction coefficients are calculated based on the above Equation (3) and a value obtained by measuring a load necessary to press and compress the bulging pieces 21, 21 to have a width equal to an inner diameter of the through hole is used as a contact load P. Further, if an applied load (Fdr) varies after a drop, an average value in a predetermined section immediately after the drop was used.

TABLE 1

|  | EX 1 | EX 2 | EX 3 | C-EX 1 | C-EX 2 | C-EX 3 |
|---|---|---|---|---|---|---|
| Through hole inner peripheral surface | | Sn | | | Sn | |
| Press-fit pin surface | | Sn—Pd | | Sn—Ag | Sn—Pb | Sn—Cu |
| Sn layer thickness (μm) | 1.47 | 1.23 | 1.00 | — | — | — |
| Pd layer thickness (μm) | 0.017 | 0.026 | 0.028 | — | — | — |
| Pd content [Pd/Pd + Sn](atomic %) | 2.1 | 3.7 | 4.9 | — | — | — |
| Contact load P (N) | | 53 | | | 53 | |
| Fmax (N) | 48.2 | 44.4 | 43.8 | 31.0 | 35.4 | 28.6 |
| Fdr (N) | 40.7 | 31.4 | 28.2 | 29.3 | 29.8 | 27.3 |
| Fap (N) | 7.5 | 13.1 | 15.6 | 1.7 | 5.7 | 1.4 |
| Mx static friction coefficient μmax | 0.46 | 0.42 | 0.42 | 0.29 | 0.34 | 0.27 |
| Dynamic friction coefficient μdr | 0.39 | 0.30 | 0.27 | 0.28 | 0.28 | 0.26 |
| Friction coefficient difference (μmax − μdr) | 0.07 | 0.12 | 0.15 | 0.02 | 0.05 | 0.01 |

Examples 1 to 3 (FIGS. 5(*a*) to (*c*)) in which the tin-palladium alloy containing layer is provided on the surface of the press-fitting pin (PF) and Comparative Example 1 to 3 (FIG. 5(*d*) to (*e*)) in which another metal layer is provided are compared for a case where the tin layer is provided on the inner peripheral surface of the through hole (TH) shown in FIG. 5. and Table 1. In the case of Examples 1 to 3, the maximum static friction coefficient is large and the dynamic friction coefficient is relatively small. A clear peak structure is seen in a region where the displacement amount is small and a height (Fap) of a withdrawal peak corresponding to the difference (μap=μmax−μdr) between the maximum static friction coefficient and the dynamic friction coefficient is large. This indicates that a high maximum static friction coefficient and a low dynamic friction coefficient can be combined and a difference of the both can be made larger by adopting a specific combination of the tin layer on the inner peripheral surface of the through hole and the tin-palladium alloy containing layer on the surface of the press-fitting pin.

In Examples 1 to 3, the content of palladium in the alloy containing layer is changed and the dynamic friction coefficient decreases as the content of palladium increases. On the other hand, as the content of palladium decreases and the content of tin increases, the maximum static friction coefficient becomes higher. The difference between the maximum static friction coefficient and the dynamic friction coefficient becomes larger as the content of palladium increases. This indicates that an effect of decreasing the dynamic friction coefficient by an increase of the palladium content is larger than an influence of a decrease of the maximum static friction coefficient. Particularly, difference values of the both friction coefficients largely differ between Examples 1 and 2.

Results of Examples 1 to 3 provided with the tin layer on the inner peripheral surface of the through hole shown in FIGS. 5(a) to (c) are compared to results of Comparative Example 4 to 6 provided with the silver layer on the inner peripheral surface of the through hole shown in FIGS. 6(a) to (c) and results of Comparative Example 7 to 9 provided with the copper layer on the inner peripheral surface of the through hole shown in FIGS. 6(d) to (f). If the inner peripheral surface of the through hole is made of silver or copper, a behavior of combining a high maximum static friction coefficient and a low dynamic friction coefficient is not obtained unlike in the case of tin. Particularly, in the case of copper, the through hole has a hard surface and an effect of adhesion to the tin part of the tin-palladium alloy containing layer can be hardly utilized, wherefore the maximum static friction coefficient decreases.

<Test B: Evaluation of Insertion-Time Maximum Friction Coefficient and Withdrawal-Time Maximum Friction Coefficient>

[Fabrication of Samples]

Using press-fit pins of a needle-eye type (t1=0.6 mm) different from those used in Examples 1 to 3, press-fitting pins in which a tin-palladium alloy containing layer was formed on a nickel underlayer were prepared. Further, a printed circuit board having tin plating applied to inner peripheral surface of through holes similar to the one used in Examples 1 to 3 of the test A was prepared as a printed circuit board.

Here, a plurality of samples with alloy containing layers having different hardnesses were prepared as samples B1 to B7 for the press-fitting pins. Specifically, the hardness of the alloy containing layer was changed by changing a film thickness ratio of a palladium layer and a tin layer (Pd film thickness/Sn film thickness×100%) in forming the alloy containing layer. The film thickness ratio of the palladium layer and the tin layer in each sample is shown together with values of the respective film thicknesses in Table 2. Further, a heating temperature for a laminated structure of the tin layer and the palladium layer was set at 300° C.

[Confirmation of Hardness]

The surface hardness of the alloy containing layer was measured for each sample. Measurements were conducted using a Vickers hardness tester.

[Evaluation of Insertion-Time Maximum Friction Coefficient and Withdrawal-Time Maximum Friction Coefficient]

The press-fitting pin of each sample was inserted into the through hole. At this time, while the press-fit pin was displaced along an axial direction, a load applied to the press-fit pin was measured using a load cell. A contact load P between the terminal and the printed board was set at 100 N. A value of the load obtained as a function of a displacement was converted into a friction coefficient based on the Equation (3) as in the above test A. A maximum value of the friction coefficient was set as the insertion-time maximum friction coefficient.

After the friction coefficient during insertion was measured as described above, the press-fitting pin was left inserted in the through hole at a room temperature for 24 hours. From this state, the press-fitting pin was withdrawn and a load was measured and converted into a friction coefficient as during insertion. Also during withdrawal, the contact load P was set at 100 N. A maximum value of the obtained friction coefficient was set as the withdrawal-time maximum friction coefficient. Note that contact oil was not used also in this test.

[Test Results]

Figure 7:
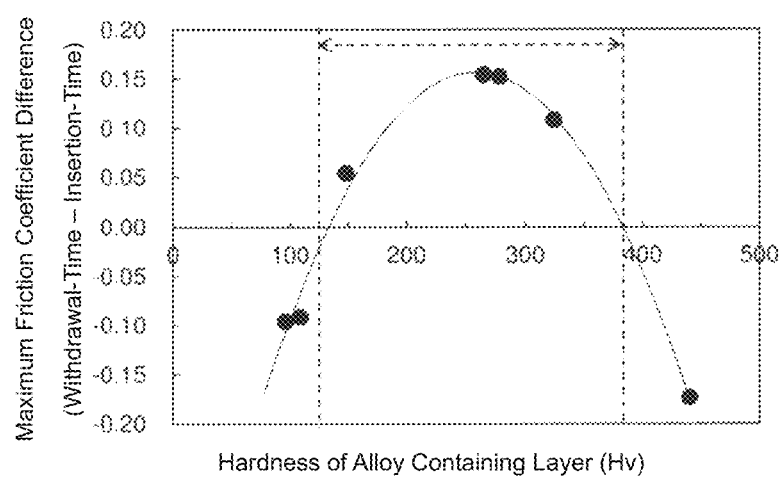

The values of the measured insertion-time maximum friction coefficient and withdrawal-time maximum friction coefficient are summarized together with the film thickness values and film thickness ratio of the palladium layer and the tin layer and the hardness of the alloy containing layer for the samples B1 to B7 in Table 2. A maximum friction coefficient difference (withdrawal-time maximum friction coefficient—insertion-time maximum friction coefficient) calculated from those values is further shown in Table 2. Further, FIG. 7 shows a relationship of the hardness of the alloy containing layer and the maximum friction coefficient difference. A curve obtained by approximating data points by a quadratic function is also shown in FIG. 7.

TABLE 2

|  | A | B | C | D | E | F | G |
|---|---|---|---|---|---|---|---|
| Sample B1 | 1.01 | 0.012 | 1.1 | 96 | 1.932 | 1.836 | −0.096 |
| Sample B2 | 1.09 | 0.018 | 1.6 | 109 | 1.870 | 1.778 | −0.092 |
| Sample B3 | 1.34 | 0.025 | 1.8 | 148 | 1.666 | 1.720 | 0.054 |
| Sample B4 | 1.03 | 0.032 | 3.1 | 265 | 1.410 | 1.564 | 0.154 |
| Sample B5 | 1.11 | 0.042 | 3.8 | 278 | 1.356 | 1.508 | 0.152 |
| Sample B6 | 1.04 | 0.054 | 5.2 | 324 | 1.334 | 1.442 | 0.108 |
| Sample B7 | 0.37 | 0.022 | 5.9 | 440 | 1.560 | 1.386 | −0.174 |

A: Sn film thickness (μm),
B: Pd film thickness (μm),
C: Pd/Sn film thickness ratio (%),
D: Alloy containing layer hardness (Hv),
E: Insertion-time maximum friction coefficient,
F: Withdrawal-time maximum friction coefficient,
G: Maximum friction coefficient difference (withdrawal-time − insertion-time)

As shown in Table 2, the hardness of the alloy containing layer increases as the Pd/Sn film thickness ratio increases. As the hardness of the alloy containing layer increases, the insertion-time maximum friction coefficient and the withdrawal-time maximum friction coefficient decrease.

Further, according to Table 2 and FIG. 7, a clear correlation is seen between the hardness of the alloy containing layer and the maximum friction coefficient difference and a behavior in which the maximum friction coefficient difference, which can be approximated by a quadratic function, has a local maximum value is obtained. As shown by broken line in FIG. 7, the maximum friction coefficient difference has a positive value roughly in a hardness region of 120 to 380 Hv. That is, the withdrawal-time maximum friction coefficient is larger than the insertion-time maximum friction coefficient.

<Test C: Evaluation of Plating Scraping and Plating Cut>

[Fabrication of Samples]

Press-fit pins formed with a tin-palladium alloy containing layer on a nickel underlayer similar to those used in Examples 1 to 3 were prepared as press-fit terminals. Further, press-fit terminals on which a nickel layer, a copper layer and a tin layer were laminated in this order instead of forming the tin-palladium alloy containing layer and to which a reflow process was performed to expose the tin layer on an outermost surface were prepared. Here, the press-fit terminals formed with the tin layer had two types of tin layers, one being a thick tin layer (0.8 µm) and the other being a thin tin layer (0.3 µm). Note that a copper-tin alloy layer was formed below the tin layer by the reflow process. Further, a printed circuit board having tin plating applied to inner peripheral surface of through holes similar to the one used in Examples 1 to 3 of the test A was prepared as a printed circuit board.

[Evaluation of Plating Scraping of Press-Fit Terminals]

Each press-fit terminal was inserted into the through hole of the printed circuit board. In that state, a boundary part between the press-fit terminal and the through hole was visually observed, and whether or not plating scraping had occurred on the press-fit terminal was examined using the presence or absence of any adhering substance to a through hole peripheral edge part as an index. Contact oil was applied to the surface of any of the press-fit terminals formed with two types of tin layers having different thicknesses before insertion into the through hole, but no contact oil was used for the press-fit terminals formed with the tin-palladium alloy containing layer.

Figure 8:
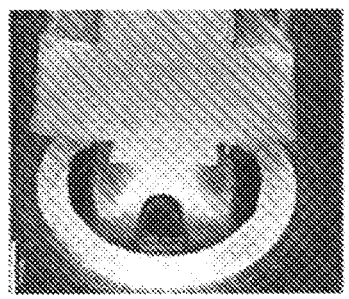
Figure 8:
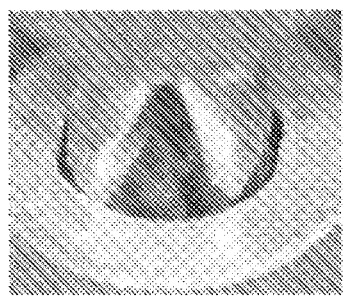
Figure 8:
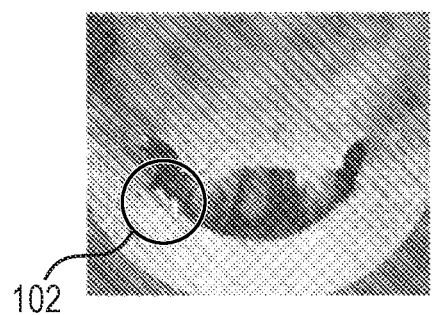

FIG. 8 show pictures obtained by photographing the boundary part between the press-fit terminal and the through hole for the press-fit terminals including (a) the tin-palladium alloy containing layer, (b) the thin tin layer and (c) the thick tin layer. In the case of the press-fit terminal including the thick tin layer of FIG. 8(c), an adhering substance 102 is seen in the peripheral edge part of the through hole as shown by an enclosing circle. This is adhered when the tin layer on the surface of the press-fit terminal is scraped off when the press-fit terminal is press-fit into the through hole. That is, if the thick tin layer is formed on the surface of the press-fit terminal, plating scraping occurs although the contact oil is used. In the case of thinning the tin layer on the surface of the press-fit terminal, no adhering substance due to plating scraping is observed as shown in FIG. 8(b) and plating scraping can be prevented. In contrast to these, when the tin-palladium alloy containing layer is formed on the surface of the press-fit terminal, no adhering substance due to plating scraping is observed as shown in FIG. 8(a) and plating scraping can be highly prevented even if no contact oil is used.

[Evaluation of Plating Cut of Through Hole]

The press-fit terminal formed with the tin-palladium alloy containing layer and the press-fit terminal formed with the thin tin layer were withdrawn from the through holes after being inserted into the through holes. After withdrawal, the through holes were cut along axes. The inner peripheral surface of the through hole was visually observed in a cross-section to examine whether or not plating cut had occurred in the inner peripheral surface. In this evaluation, the contact oil was used for none of the press-fit terminals.

Figure 9:
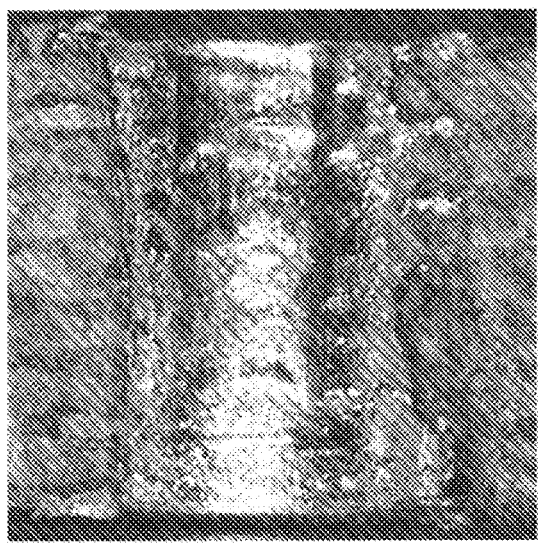
FIG. 9(a) shows a case where an alloy containing layer is formed on the surface of the press-fit terminal and FIG. 9(b) shows a case where a thin tin layer is formed on the surface of the press-fit terminal, and contact oil is not used in both cases shown in FIGS. 9(a) and 9(b).
Figure 9:
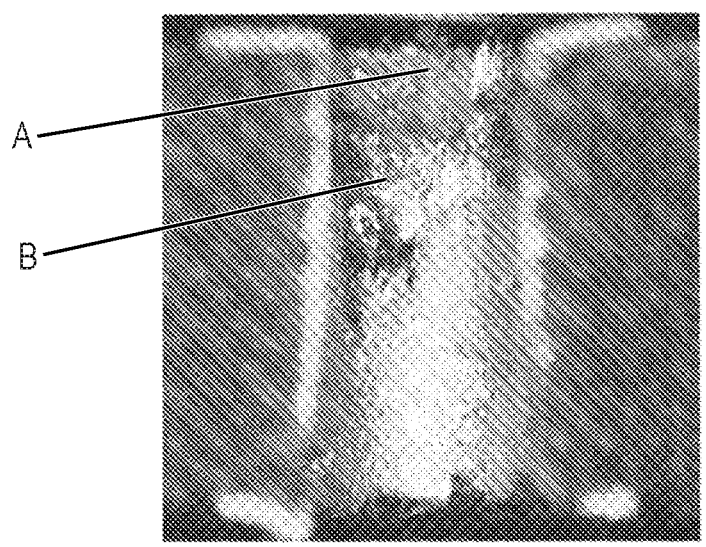

FIG. 9 show pictures obtained by photographing the cross-sections of the through holes when the press-fit terminals including (a) the tin-palladium alloy containing layer and (b) the thin tin layer were inserted and withdrawn. In the case of FIG. 9(b) of inserting and withdrawing the press-fit terminal including the tin layer, the exposure of a base plate material as indicated by reference sign A in FIG. 9(b) and the exposure of the copper underlayer as indicated by reference sign B are seen and it is understood that plating cut had occurred in the through hole. This is thought to be due to the influence of the hardness of the tin-copper alloy layer as an underlayer since the tin layer of the press-fit terminal is thin. On the other hand, in the case of FIG. 9(a) of inserting and withdrawing the press-fit terminal including the tin-palladium alloy containing layer, no structure caused by the exposure of the base plate material or the copper underlayer is seen on the inner peripheral surface of the through hole and the surface uniformly covered with the tin layer is observed. That is, the plating cut of the through hole can be prevented although the contact oil is not used. This is thought to be because the tin part having a sufficient thickness is exposed in the tin-palladium alloy containing layer and the soft surface is brought into contact with the inner peripheral surface of the through hole.

Although the embodiment has been described in detail above, the present invention is not limited to the above embodiment at all and various changes can be made without departing from the gist of the present invention.

LIST OF REFERENCE SIGNS 1 press-fit terminal connection structure
2 press-fit terminal
20 board connecting portion
21 bulging piece
21a contact point portion
3 printed circuit board
30 through hole
31 inner peripheral surface
F applied load
P contact load

The invention claimed is:

1. A press-fit terminal connection system comprising:
a printed circuit board having a through hole, the through hole including a tin layer on an outermost surface of an inner peripheral surface and at least a contact point portion on the tin layer; and
a press-fit terminal having a board connecting portion configured to be press-fit into the through hole of the printed circuit board such that the through hole and the press-fit terminal are electrically in contact at a contact point portion of the press-fit terminal and the contact point portion on the tin layer of the through hole, the press-fit terminal including:
an alloy containing layer having a domain structure of alloy parts and tin parts, the alloy parts being made of an alloy mainly containing tin and palladium, and the tin parts are made of pure tin or an alloy having a higher ratio of tin to palladium than the alloy parts, both the alloy parts and the tin parts being exposed on an outermost surface of the press-fit terminal;
a base; and
a nickel under layer disposed between the alloy containing layer and the base, the nickel under layer being composed of a nickel-tin alloy layer and a pure nickel layer, the nickel-tin alloy layer being disposed between the alloy containing layer and the nickel layer, and the nickel layer being disposed between the nickel-tin alloy layer and the base, wherein:
a content of palladium in the alloy containing layer is 2 atomic % or higher; and
a surface hardness of the alloy containing layer is 120 Hv or greater and 380 Hv or less.

2. The press-fit terminal connection system according to claim 1, wherein a layer of contact oil is not on respective surfaces of the contact point portions of the press-fit terminal and on the tin layer of the through hole.

3. The press-fit terminal connection system according to claim 1, wherein a maximum value of a friction coefficient between the tin layer of the through hole and the contact point portion of the press-fit terminal covered with the alloy containing layer is larger when the press-fit terminal is withdrawn from the through hole than when the press-fit terminal is inserted into the through hole.

4. The press-fit terminal connection system according to claim 1, wherein a difference between a maximum static friction coefficient and a dynamic friction coefficient between the tin layer of the through hole and the contact point portion of the press-fit terminal covered with the alloy containing layer is 0.06 or greater.

5. The press-fit terminal connection system according to claim 1, wherein a maximum static friction coefficient between the tin layer of the through hole and the contact point portion of the press-fit terminal covered with the alloy containing layer is 0.4 or greater.

6. The press-fit terminal connection system according to claim 1, wherein a dynamic friction coefficient between the tin layer of the through hole and the contact point portion of the press-fit terminal covered with the alloy containing layer is less than 0.4.

7. The press-fit terminal connection system according to claim 1, wherein the content of palladium in the alloy containing layer is 3 atomic % or greater.

8. A press-fit terminal connection system comprising:
a printed circuit board having a through hole, the through hole including:
  a tin layer on an outermost surface of an inner peripheral surface,
  a base on an innermost layer of the inner peripheral surface,
  a copper under layer in between the tin layer and the base, and
  at least a contact portion on the tin layer; and
a press-fit terminal having a board connecting portion configured to be press-fit into the through hole of the printed circuit board such that the through hole and the press-fit terminal are electrically in contact at a contact point portion of the press-fit terminal and the contact point portion on the tin layer of the through hole, wherein:
  the press-fit terminal includes an alloy containing layer having a domain structure of alloy parts and tin parts, the alloy parts being made of an alloy mainly containing tin and palladium, and the tin parts are made of pure tin or an alloy having a higher ratio of tin to palladium than the alloy parts, both the alloy parts and the tin parts being exposed on an outermost surface of the press-fit terminal,
  a content of palladium in the alloy containing layer is 2 atomic % or higher; and
  a surface hardness of the alloy containing layer is 120 Hv or greater and 380 Hv or less.

9. The press-fit terminal connection system according to claim 8, wherein a layer of contact oil is not on respective surfaces of the contact point portions of the press-fit terminal and the through hole.

10. The press-fit terminal connection system according to claim 8, wherein a maximum value of a friction coefficient between the tin layer of the through hole and the contact point portion of the press-fit terminal covered with the alloy containing layer is larger when the press-fit terminal is withdrawn from the through hole than when the press-fit terminal is inserted into the through hole.

11. The press-fit terminal connection system according to claim 8, wherein a difference between a maximum static friction coefficient and a dynamic friction coefficient between the tin layer of the through hole and the contact point portion of the press-fit terminal covered with the alloy containing layer is 0.06 or larger.

12. The press-fit terminal connection system according to claim 8,
wherein a maximum static friction coefficient between the tin layer of the through hole and the contact point portion of the press-fit terminal covered with the alloy containing layer is 0.4 or larger.

13. The press-fit terminal connection system according to claim 8, wherein a dynamic friction coefficient between the tin layer of the through hole and the contact point portion of the press-fit terminal covered with the alloy containing layer is below 0.4.

14. The press-fit terminal connection system according to claim 8, wherein the content of palladium in the alloy containing layer is 3 atomic % or higher.

15. The press-fit terminal connection system according to claim 8, wherein an underlayer made of nickel or nickel alloy is provided between the base material constituting the press-fit terminal and the alloy containing layer.

* * * * *